United States Patent
Wu et al.

(10) Patent No.: US 7,535,788 B2
(45) Date of Patent: May 19, 2009

(54) DYNAMIC POWER CONTROL FOR EXPANDING SRAM WRITE MARGIN

(75) Inventors: Jui-Jen Wu, Hsinchu (TW); Kun-Lung Chen, Taipei (TW); Hung-Jen Liao, Hsin-Chu (TW); Yung-Lung Lin, Taichung (TW); Chen Yen-Huei, Hsinchu (TW); Dao-Ping Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 152 days.

(21) Appl. No.: 11/636,173

(22) Filed: Dec. 8, 2006

(65) Prior Publication Data

US 2008/0137449 A1     Jun. 12, 2008

(51) Int. Cl.
    *G11C 5/14* (2006.01)
(52) U.S. Cl. .................. 365/226; 365/104; 365/185.26
(58) Field of Classification Search ................. 365/226, 365/104, 185.26, 205, 207, 203, 185.21, 365/191, 230.06, 185.14
See application file for complete search history.

(56) References Cited

U.S. PATENT DOCUMENTS 6,549,042 B2 * 4/2003 Proebsting .................. 327/51
7,088,626 B2 * 8/2006 Mori et al. .............. 365/189.11
2004/0141392 A1 * 7/2004 Lee et al. .................... 365/200

OTHER PUBLICATIONS

Masanao Yamaoka et al., "Low-Power Embedded SRAM Modules with Expanded Margins for Writings", 2005 IEEE International Solid-State Circuits Conference, Digest of Technical Papers, Feb. 9, 2005, pp. 480-481 & 661.
K. Zhang et al., "A 3-GHz 70Mb SRAM in 65nm CMOS Technology with Integrated Column-Based Dynamic Power Supply", 2005 IEEE International Solid-State Circuits Conference, Digest of Technical Papers, Feb. 9, 2005, pp. 475 & 611.

* cited by examiner

*Primary Examiner*—Dang T Nguyen
(74) *Attorney, Agent, or Firm*—K & L Gates LLP

(57) ABSTRACT

A writing dynamic power control circuit is disclosed, which comprises a BL and its complementary BLB, at least one memory cell coupled to both the BL and BLB, a first NMOS transistor having a source, a drain and a gate coupled to the BL, the Vss and a first data signal, respectively, a second NMOS transistor having a source, a drain and a gate coupled to the BLB, the Vss and a second data signal, respectively, wherein the second data signal is complementary to the first data signal, a first PMOS transistor having a source, a drain and a gate coupled to a high voltage power supply (CVDD) node, the BLB and the BL, respectively, and a second PMOS transistor having a source, a drain and a gate coupled to the CVDD node, the BL and the BLB, respectively.

13 Claims, 2 Drawing Sheets

DYNAMIC POWER CONTROL FOR EXPANDING SRAM WRITE MARGIN

BACKGROUND

The present invention relates generally to an integrated circuit (IC) design, and more particularly to a system of a dynamic power control circuit implemented to an array of SRAM devices for improving write margin.

In deep sub-micron technology, an embedded SRAM has become a very popular storage unit for high-speed communication devices, image processing devices, and other system-on-chip (SOC) products. For a typical SRAM cell, one of the most important aspects is the stability of the cell. The write margin of a SRAM cell is one of the key factors that determine the stability of the device. As data is programmed within a SRAM cell, a large write margin can improve the writing speed and ensure that the correct data is being written.

Several attempts have been made in the past to improve and expand the write margin of a SRAM cell. One of such attempts floats power supplies to a cell array being accessed during a write cycle. However, this may result in lowering writing speeds and even degrading data retentions.

Another attempt utilizes two different power supplies, and a lower voltage is supplied to the cell array during write operations. However, implementing two power supplies within an embedded IC is difficult and will significantly increase the die size of such IC.

Desirable in the art of SRAM designs are circuits that improve the write margin without degrading the data retention or increasing the die size.

SUMMARY

In view of the foregoing, this invention provides a writing dynamic power control circuit that may be implemented to an array of SRAM for improving write margin.

In a first embodiment, the writing dynamic power control circuit comprises a bit-line (BL) and its complementary bit-line-bar (BLB), at least one memory cell coupled to both the BL and BLB, a first NMOS transistor having a source, a drain and a gate coupled to the BL, the Vss and a first data signal, respectively, a second NMOS transistor having a source, a drain and a gate coupled to the BLB, the Vss and a second data signal, respectively, wherein the second data signal is complementary to the first data signal, a first PMOS transistor having a source, a drain and a gate coupled to a high voltage power supply (CVDD) node, the BLB and the BL, respectively, and a second PMOS transistor having a source, a drain and a gate coupled to the CVDD node, the BL and the BLB, respectively, wherein a write operation is accomplished through applying a data at the first and second data signals.

In a second embodiment, a third PMOS transistor having a source, a drain and a gate coupled to a chip level high voltage power supply (VDD), the CVDD node and a first power control node, respectively, may be added to the circuit described in the first embodiment.

The construction and method of operation of the invention, however, together with additional objects and advantages thereof will be best understood from the following description of specific embodiments when read in connection with the accompanying drawings.

BRIEF DESCRIPTION OF THE DRAWINGS

The present invention is illustrated by way of example, and not by way of limitation, in the figures of the accompanying drawings in which like reference numerals refer to similar elements.

DESCRIPTION

The following will provide a detailed description of a dynamic power control circuit that may be implemented in SRAMs for improving write margin.

Figure 1:
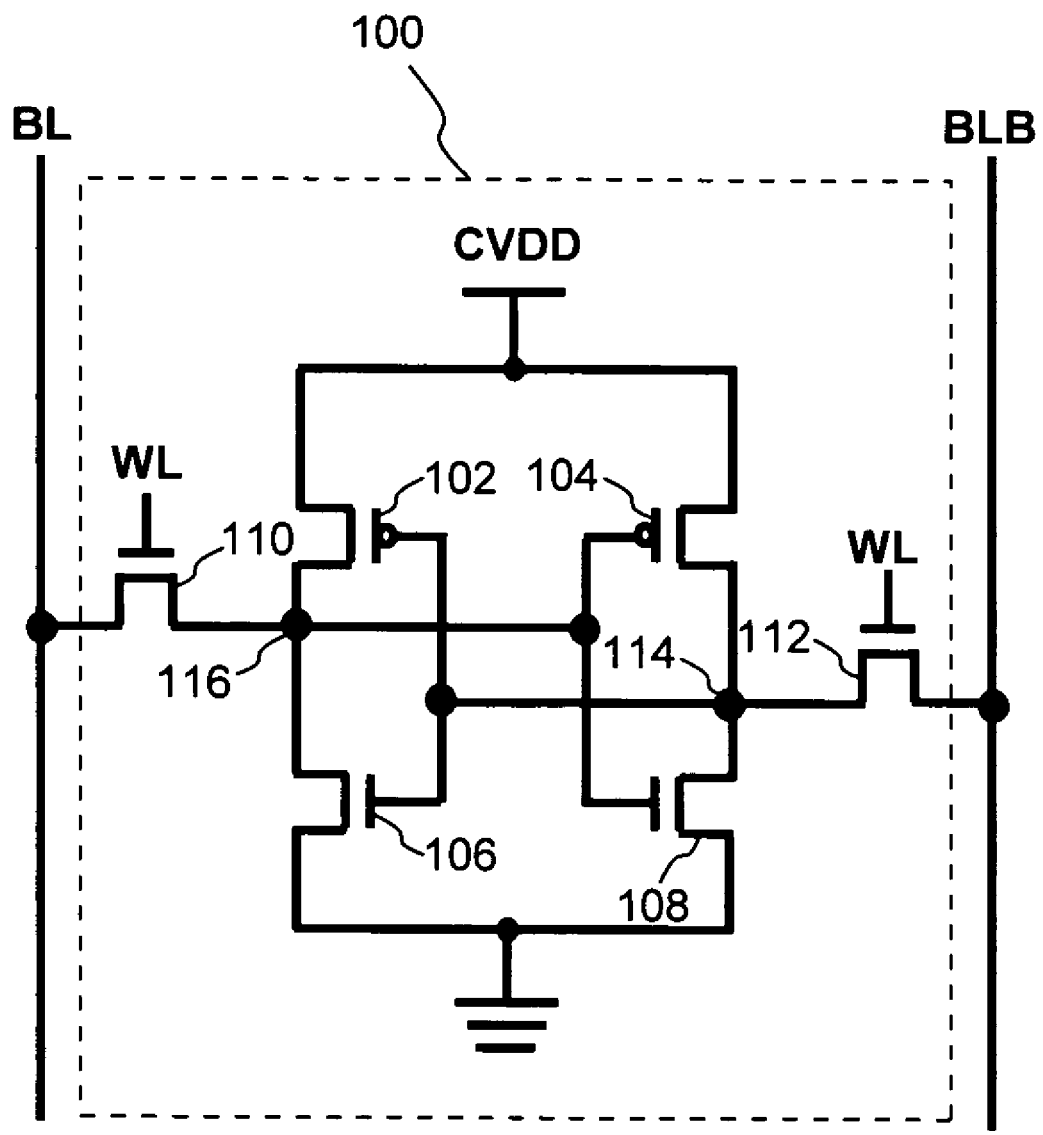
FIG. 1 is a schematic diagram illustrating a conventional SRAM cell.

FIG. 1 is a schematic diagram illustrating a conventional SRAM cell 100. The SRAM cell 100 comprises two PMOS transistors 102 and 104, as well as four NMOS transistors 106, 108, 110, and 112. The PMOS transistors 102 and 104 and the NMOS transistors 106 and 108 form two cross-coupled invertors whereby a digital data of "0" or "1" may be latched at node 114 or 116. The NMOS transistors 110 and 112 are used as pass-gate devices for controlling accesses to the storage nodes 114 and 116 by a bit-line (BL) and a bit-line-bar (BLB) which is complementary to the BL, and their gates are coupled to a word-line (WL). The sources of the PMOS transistors 102 and 104 are both connected to a high voltage power supply (CVDD) while the sources of the NMOS transistors 106 and 108 are both connected to a complementary low voltage power supply (VSS).

During a write operation of the SRAM cell 100, the NMOS transistors 110 and 112 are turned on by a high voltage asserted word-lines (WL). Data are forced on the BL and BLB which are coupled to the storage nodes 116 and 114 through the turned-on NMOS transistors 110 and 112, respectively. Essentially, the write operation is the data voltage sources applied on the BL and BLB overcome the cross-coupled invertors formed the by the PMOS transistors 102 and 104 and NMOS transistors 106 and 108. Therefore lower CVDD will make an easier write operation.

On the other hand, a read operation is for the cross-coupled invertors to drive the BL and BLB; therefore, a higher CVDD will make the read operation more robust.

Figure 2:
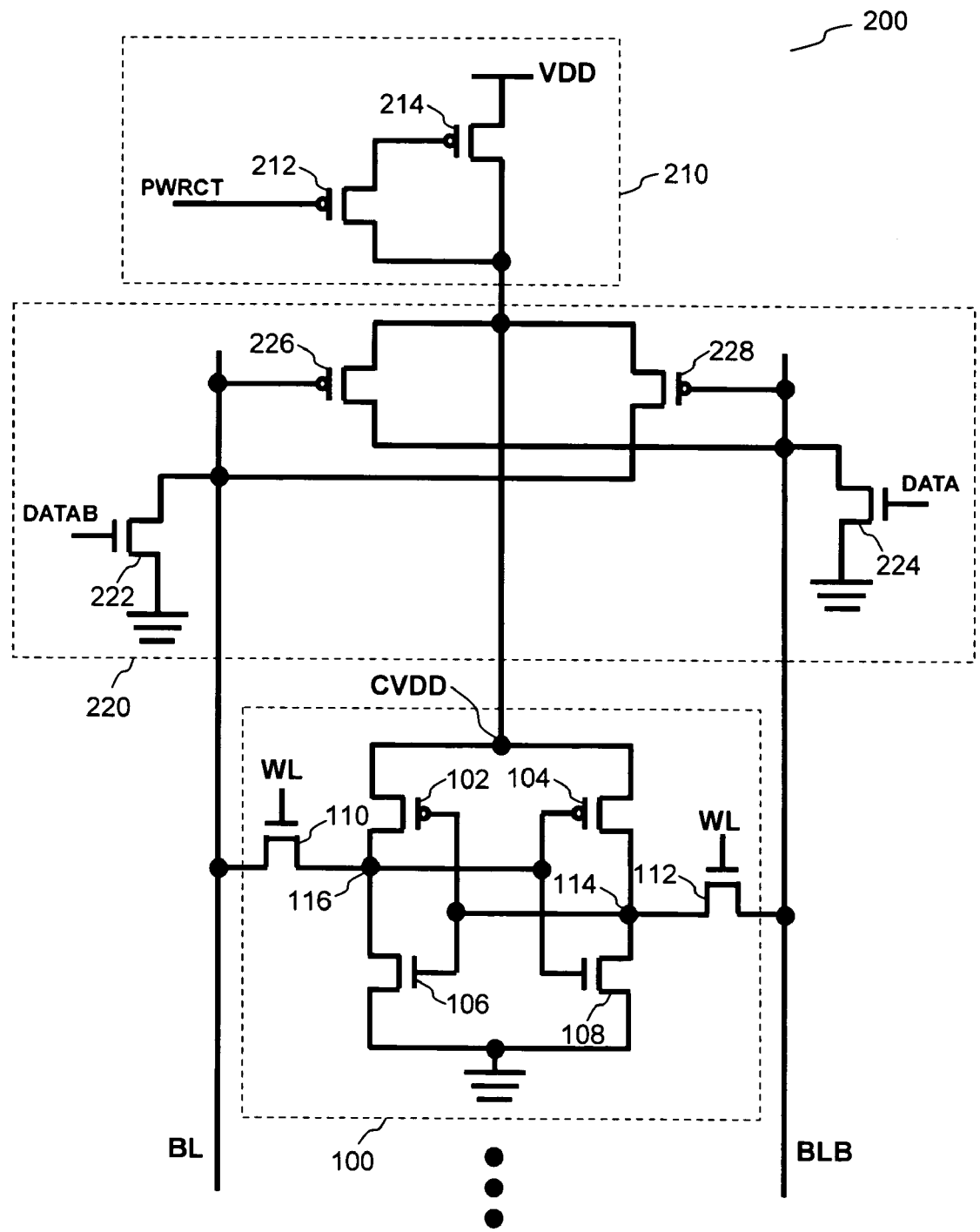
FIG. 2 is a schematic diagram illustrating a proposed dynamic-power-control writing circuit used in a SRAM in accordance with one embodiment of the present invention.

FIG. 2 is a schematic diagram illustrating a proposed dynamic-power-control writing circuit 202 used in a SRAM array 200 for expanding write margin in accordance with one embodiment of the present invention. The SRAM array 200 comprises a power supply block 210, a dynamic-power-control writing circuit 220 and a plurality of SRAM cells 100 commonly coupled to the BL and BLB. The plurality of SRAM cells 100 are commonly referred to as a column of cells, and the individual of which has already been shown in FIG. 1 and described in foregoing paragraphs, it requires no further discussion here.

Referring to FIG. 2, the power supply block 210 may be implemented as a PMOS transistor 214 have a source coupled to a chip high voltage power supply (VDD) and a drain coupled to node CVDD which is a node from where power is supplied to the SRAM cell array 100. A gate of the PMOS transistor 214 is coupled to its drain through a controllable PMOS transistor 212. A power control signal, PWRCTB, is coupled to the gate of the PMOS transistor 212. When the signal PWRCTB is asserted a logic LOW voltage, the PMOS transistor 212 is turned on; therefore, the PMOS transistor 214 will function as a forward-biased diode. When the signal PWRCTB is asserted a logic HIGH voltage, the PMOS transistor 212 is turned off, and the PMOS transistor 214 is turned off as well. Apparently, if the gate of the PMOS transistor 214 is coupled directly to the CVDD node, the power supply block 210 will become a constantly on forward-biased diode. On the other hand, the PMOS transistor 212 can simply be eliminated and the signal PWRCTB may be coupled directly to the gate of the PMOS transistor 214 to perform turning on or off the power supply to the SRAM cell array 100.

Referring to FIG. 2, the dynamic-power-control writing circuit 220 may be implemented as two NMOS transistors 222 and 224 and two PMOS transistors 226 and 228. The NMOS transistor 222 is coupled between the BL and the VSS with a gate coupled to a data signal DATAB. Similarly, the NMOS transistor 224 is coupled between the BLB and the VSS with a gate coupled to another data signal DATA which is complementary to the data signal DATAB. The PMOS transistor 226 is coupled between the node CVDD and the BLB with a gate coupled to the BL. Similarly, the PMOS transistor 228 is coupled between the node CVDD and the BL with a gate coupled to the BLB. Apparently, the BL side's NMOS transistor 222 and PMOS transistor 226 are symmetrical to the BLB side's NMOS transistor 224 and 228. Therefore, following functional descriptions will be focused on writing a logic LOW case, i.e., the data signal DATA is asserted a "0", and people having skill in the art would recognize that writing a logic HIGH case, i.e., data signal DATA is asserted a "1", works just the same as the writing a logic LOW case. Besides, as in conventional SRAM, the BL and BLB are pre-charged to logic HIGH prior to a write operation.

Referring to FIG. 2, when writing a logic LOW, i.e., the data signal DATA is asserted a "0", and the data signal DATAB is asserted a "1". The signal DATAB ="1" turns on the NMOS transistor 222 which pulls the BL to the VSS. With the BL voltage being lowered, the PMOS transistor 226 will be turned on. On the other hand, the signal DATA ="0" keeps NMOS transistor 224 at off state. Assuming the SRAM cell 100 stores a data opposite to the intended writing data prior to the writing, i.e., a "1" at node 116, and a "0" at node 114. With the pass-gate NMOS transistors 110 and 112 being turned on by a selected WL during the writing, node 116 will be pulled to the VSS or the "0" through the NMOS transistors 110 and 222. Node 114 will be pulled to the CVDD or the "1" through the NMOS and PMOS transistors 112 and 226. That is a writing process of the data at the signals DATA and DATAB trying to flip the selected SRAM cell 100. During this writing process, the BLB voltage is dropping that may cause the PMOS transistor 228 to be turned on. Then the PMOS transistor 228 and the NMOS transistor 222 form a conduction path. Together with another conduction path formed by the NMOS and PMOS transistors 112 and 226, they provide an additional current flow through node CVDD. Higher current flowing through the PMOS transistor 214 will cause higher voltage drop across its source and drain, therefore, voltage at the node CVDD will be lowered, which in turn will make the writing easy and enhance the write margin. However, as aforementioned the conductive PMOS transistor 214 is essentially a forward-biased diode, which may clamp the CVDD voltage at a certain level determined by the size of the PMOS transistor 214. This may prevent the CVDD voltage from dropping too much to degrade data retentions of the SRAM cell 100. On the other hand, when the data stored in the SRAM cell 100 is completely flipped, i.e., node 116 is the "0" and node 114 is the "1", both the PMOS transistors 226 and 228 will stop conducting, and therefore, there is no addition current flowing through the node CVDD. In fact, all static currents are shut up once the data in the SRAM cell 100 completes flipping. The CVDD voltage will be pulled to VDD, which will provide good data retention at the SRAM cells 100.

Then assuming the SRAM cell 100 stores the same data as the intended writing data prior to the writing, i.e., the "0" at node 116, and the "1" at node 114. Since both source and drain of the NMOS transistor 222 is at logic LOW level, there will be no conduction current through the NMOS transistor 222. A logic HIGH at node 114 also stops the conduction through the path formed by the NMOS transistor 112 and the PMOS transistor 226. Therefore, the CVDD voltage will not be lowered, and data at the storage nodes 116 and 114 remains as intended.

In essence, the writing dynamic power control circuit 220 functions both as a write driver and a dynamic power controller during write operations. During read or stand-by operations, the signals DATA and DATAB are kept at logic LOW to turn off the NMOS transistors 222 and 224. The PMOS transistors 226 and 228 also remain in off state during these operations. Because in a conventional SRAM stand-by operation, the BL and BLB are pre-charged to logic HIGH. Even during a read operation, the BL or BLB will develop only a very small voltage drop, e.g., 100 mV, which is not enough to turn on the PMOS transistor 226 or 228.

Although the present invention is described using SRAM as an example, one with skills in the art would appreciate that the present invention may be applied to other memories as long as dynamic power control is desired and a selected memory cell may provide a current path.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A writing dynamic power control circuit comprising:
a bit-line (BL) and a bit-line-bar (BLB) complementary to each other;
at least one memory cell coupled to both the BL and BLB;
a first NMOS transistor having a source, a drain and a gate coupled to the BL, a low voltage power supply (Vss) and a first data signal, respectively;
a second NMOS transistor having a source, a drain and a gate coupled to the BLB, the Vss and a second data signal, respectively, wherein the second data signal is complementary to the first data signal;
a first PMOS transistor having a source, a drain and a gate coupled to a high voltage power supply (CVDD) node, the BLB and the BL, respectively;
a second PMOS transistor having a source, a drain and a gate coupled to the CVDD node, the BL and the BLB, respectively; and a third PMOS transistor having a source, a drain and a gate coupled to a chip level high voltage power supply (VDD), the CVDD node and a first power control node, respectively, wherein a write operation is accomplished through applying a data at the first and second data signals, and the first power control node is coupled to the CVDD node.

2. The writing dynamic power control circuit of claim 1, wherein the memory cell is a static random access memory (SRAM) cell.

3. The writing dynamic power control circuit of claim 2, wherein the SRAM cell comprises:
   a first pass-gate transistor having a source and a drain coupled between a first storage node and the BL and a gate controlled by a word-line (WL);
   a second pass-gate transistor having a source and drain coupled between a second storage node and the BLB and a gate controlled also by the WL, wherein the first and second storage nodes are complementary to each other; and
   two cross-coupled inverters forming the first and second storage nodes.

4. The writing dynamic power control circuit of claim 1 further comprising a fourth PMOS transistor having a source, a drain and a gate coupled to the first power control node, the CVDD node and a second power control node.

5. A writing dynamic power control circuit comprising:
   a bit-line (BL) and a bit-line-bar (BLB) complementary to each other;
   at least one static random access memory (SRAM) cell coupled to both the BL and BLB;
   a first NMOS transistor having a source, a drain and a gate coupled to the BL, a low voltage power supply (Vss) and a first data signal, respectively;
   a second NMOS transistor having a source, a drain and a gate coupled to the BLB, the Vss and a second data signal, respectively, wherein the second data signal is complementary to the first data signal;
   a first PMOS transistor having a source, a drain and a gate coupled to a high voltage power supply (CVDD) node, the BLB and the BL, respectively;
   a second PMOS transistor having a source, a drain and a gate coupled to the CVDD node, the BL and the BLB, respectively; and
   a third PMOS transistor having a source, a drain and a gate coupled to a chip level high voltage power supply (VDD), the CVDD node and a first power control node, respectively,
   wherein a write operation is accomplished through applying a data at the first and second data signals.

6. The writing dynamic power control circuit of claim 5, wherein the SRAM cell comprises:
   a first pass-gate transistor having a source and a drain coupled between a first storage node and the BL and a gate controlled by a word-line (WL);
   a second pass-gate transistor having a source and drain coupled between a second storage node and the BLB and a gate controlled also by the WL, wherein the first and second storage nodes are complementary to each other; and
   two cross-coupled inverters forming the first and second storage nodes.

7. The writing dynamic power control circuit of claim 5, wherein the first power control node is coupled to the CVDD node.

8. The writing dynamic power control circuit of claim 5 further comprising a fourth PMOS transistor having a source, a drain and a gate coupled to the first power control node, the CVDD node and a second power control node.

9. A writing dynamic power control circuit comprising:
   a bit-line (BL) and a bit-line-bar (BLB) complementary to each other;
   at least one memory cell coupled to both the BL and BLB;
   a first NMOS transistor having a source, a drain and a gate coupled to the BL, a low voltage power supply (Vss) and a first data signal, respectively;
   a second NMOS transistor having a source, a drain and a gate coupled to the BLB, the Vss and a second data signal, respectively, wherein the second data signal is complementary to the first data signal;
   a first PMOS transistor having a source, a drain and a gate coupled to a high voltage power supply (CVDD) node, the BLB and the BL, respectively;
   a second PMOS transistor having a source, a drain and a gate coupled to the CVDD node, the BL and the BLB, respectively; and
   a third PMOS transistor having a source, a drain and a gate coupled to a chip level high voltage power supply (VDD), the CVDD node and a first power control node, respectively,
   wherein a write operation is accomplished through applying a data at the first and second data signals.

10. The writing dynamic power control circuit of claim 9, wherein the memory cell is a static random access memory (SRAM) cell.

11. The writing dynamic power control circuit of claim 10, wherein the SRAM cell comprises:
   a first pass-gate transistor having a source and a drain coupled between a first storage node and the BL and a gate controlled by a word-line (WL);
   a second pass-gate transistor having a source and drain coupled between a second storage node and the BLB and a gate controlled also by the WL, wherein the first and second storage nodes are complementary to each other; and
   two cross-coupled inverters forming the first and second storage nodes.

12. The writing dynamic power control circuit of claim 9, wherein the first power control node is coupled to the CVDD node.

13. The writing dynamic power control circuit of claim 9 further comprising a fourth PMOS transistor having a source, a drain and a gate coupled to the first power control node, the CVDD node and a second power control node.

* * * * *